(12) United States Patent
Sugimoto

(10) Patent No.: US 9,379,181 B2
(45) Date of Patent: Jun. 28, 2016

(54) SEMICONDUCTOR DEVICE

(71) Applicant: Masahiro Sugimoto, Toyota (JP)

(72) Inventor: Masahiro Sugimoto, Toyota (JP)

(73) Assignees: TOYOTA JIDOSHA KABUSHIKI KAISHA, Toyota-Shi (JP); DENSO CORPORATION, Kariya-Shi (JP)

( * ) Notice: Subject to any disclaimer, the term of this patent is extended or adjusted under 35 U.S.C. 154(b) by 21 days.

(21) Appl. No.: 14/258,251

(22) Filed: Apr. 22, 2014

(65) Prior Publication Data

US 2014/0319540 A1   Oct. 30, 2014

(30) Foreign Application Priority Data

Apr. 25, 2013  (JP) ................................ 2013-092255

(51) Int. Cl.
| H01L 29/66 | (2006.01) |
| H01L 29/76 | (2006.01) |
| H01L 27/16 | (2006.01) |
| H01L 29/94 | (2006.01) |
| H01L 27/06 | (2006.01) |
| H01L 29/06 | (2006.01) |
| H01L 29/78 | (2006.01) |
| H01L 29/32 | (2006.01) |
| H01L 29/40 | (2006.01) |
| H01L 29/423 | (2006.01) |
| H01L 29/739 | (2006.01) |
| H01L 29/16 | (2006.01) |

(52) U.S. Cl.
CPC ........ *H01L 29/0653* (2013.01); *H01L 29/7804* (2013.01); *H01L 29/0623* (2013.01); *H01L 29/0696* (2013.01); *H01L 29/1608* (2013.01); *H01L 29/32* (2013.01); *H01L 29/407* (2013.01); *H01L 29/42368* (2013.01); *H01L 29/66068* (2013.01); *H01L 29/7397* (2013.01)

(58) Field of Classification Search
CPC .............................. H01L 27/16; H01L 29/778
USPC ................... 257/328, 334, 378, 350, E29.059
See application file for complete search history.

(56) References Cited

U.S. PATENT DOCUMENTS

| 2003/0052383 A1* | 3/2003 | Nemoto | ................ H01L 29/861 257/471 |
| 2003/0168701 A1* | 9/2003 | Voldman | ............. H01L 27/0255 257/355 |
| 2009/0230500 A1* | 9/2009 | Yoshikawa | .......... H01L 27/0255 257/470 |
| 2014/0021536 A1* | 1/2014 | Darwish | ............... H01L 29/408 257/330 |

FOREIGN PATENT DOCUMENTS

| JP | 2000-323654 A | 11/2000 |
| JP | 2012-195339 A | 10/2012 |

* cited by examiner

*Primary Examiner* — Kimberly Rizkallah
*Assistant Examiner* — Brian Turner
(74) *Attorney, Agent, or Firm* — Kenyon & Kenyon LLP

(57) ABSTRACT

A semiconductor device is provided with a semiconductor substrate in which a power semiconductor element part and a temperature sensing diode part are provided. The temperature sensing diode part includes a first semiconductor region, a second semiconductor region, a first base region, and a first drift region. In the semiconductor substrate, an isolation trench is formed, which passes through the first base region, extends to the first drift region, and surrounds an outer periphery of the temperature sensing diode part. At least a part of one of side walls of the isolation trench is in contact with the power semiconductor element part, and the other side wall of the isolation trench is in contact with the temperature sensing diode part.

7 Claims, 6 Drawing Sheets

SEMICONDUCTOR DEVICE

INCORPORATION BY REFERENCE

The disclosure of Japanese Patent Application No. 2013-092255 filed on Apr. 25, 2013 including the specification, drawings and abstract is incorporated herein by reference in its entirety.

BACKGROUND OF THE INVENTION

1. Field of the Invention

A technology disclosed in this description relates to a semiconductor device.

2. Description of Related Art

Japanese Patent Application Publication No. 2012-195339 A (JP 2012-195339 A) discloses a semiconductor device in which a temperature sensing diode and an IGBT are provided in a same semiconductor substrate. It is stated that, in this semiconductor device, it is possible to carry out highly accurate temperature detection in an entire temperature range of rated temperature of the semiconductor device.

In a case where a temperature sensing diode is provided in a semiconductor device, it is normal that a polysilicon layer is formed on an upper surface of a substrate through an insulating layer, and an anode and a cathode are formed in the polysilicon layer. When the temperature sensing diode is applied to a semiconductor device (for example, a semiconductor device using a SiC substrate) that operates under high temperature, highly accurate temperature detection might not be possible due to leak current. In short, in the semiconductor device that works under high temperature, temperature of the polysilicon layer becomes high, and leak current is easily generated. When leak current is generated in a temperature sensing diode that uses a polysilicon layer, highly accurate temperature detection becomes difficult. Therefore, it is considered to form the temperature sensing diode in a semiconductor substrate. This prevents leak current, and temperature detection by the temperature sensing diode becomes possible even under high temperature. Since the temperature sensing diode is formed in the semiconductor substrate, it is possible to arrange the temperature sensing diode in the vicinity of a power semiconductor element, which makes it possible to detect temperature of the power semiconductor element more accurately.

However, when the temperature sensing diode part and the power semiconductor element part are provided in the same semiconductor substrate, a parasitic bipolar transistor might operate. For example, a case is considered where a temperature sensing diode part and an n type MOSFET part are provided in a same semiconductor substrate. In this case, a p type base region is arranged so as to be in contact with an upper surface of an n type drift region. The p type base region is arranged in a range that faces an upper surface of the semiconductor substrate. A p type anode region and an n type cathode region are arranged in the p type base region of the temperature sensing diode part, and an n type source region and a p type contact region are arranged in the p type base region of the n type MOSFET part. As electropositive potential is applied to the anode region of the temperature sensing diode part, electropositive potential is applied to the base region of the temperature sensing diode part. Then, an npn parasitic bipolar transistor, which is structured by the n type cathode region, the p type base region, and the n type drift region, operates. As a result, large current flows to the cathode region, and temperature detection accuracy of the temperature sensing diode might be degraded.

SUMMARY OF THE INVENTION

In this description, a technology is provided for preventing degradation of temperature detection accuracy of a temperature sensing diode part in a semiconductor device in which the temperature sensing diode part and a power semiconductor element part are provided in a same semiconductor substrate.

A semiconductor device disclosed in this description is provided with a semiconductor substrate in which a power semiconductor element part and a temperature sensing diode part are provided. The temperature sensing diode part includes a first semiconductor region, a second semiconductor region, a first base region, and a first drift region. The first semiconductor region is a first conductivity type, and arranged in a range that faces an upper surface of the semiconductor substrate. The second semiconductor region is a second conductivity type, and arranged in a range that faces the upper surface of the semiconductor substrate. The first base region is the first conductivity type, arranged in a range that faces the upper surface of the semiconductor substrate, and in contact with and surrounds the first semiconductor region and the second semiconductor region. The first drift region is the second conductivity type, in contact with a lower surface of the first base region, and isolated from the first semiconductor region and the second semiconductor region by the first base region. In the semiconductor substrate, an isolation trench is formed, which passes through the base region, extends to the first drift region, and surrounds an outer periphery of the temperature sensing diode part. At least a part of one of side walls of the isolation trench is in contact with the power semiconductor element, and the other side wall of the isolation trench is in contact with the temperature sensing diode part.

In the semiconductor device stated above, the isolation trench is formed in the semiconductor substrate. Therefore, a large number of defects are generated near a boundary between the semiconductor substrate and the isolation trench (in short, on the side walls and a bottom wall of the isolation trench). The isolation trench surrounds the outer periphery of the temperature sensing diode part, and passes through the first base region, and the other side wall of the isolation trench is in contact with the temperature sensing diode part. Thus, a large number of defects are generated near a boundary between the first base region and the isolation trench. Therefore, a minority carrier flown into the first base region is captured by the defects, and a lifetime of the minority carrier is significantly reduced compared to a case where the isolation trench is not formed. Hence, even if voltage in a forward direction is applied between the first semiconductor region and the second semiconductor region of the temperature sensing diode part, a current amplification factor hFE of a parasitic bipolar transistor, which is structured by the second conductivity type second semiconductor region, the first conductivity type base region, and the second conductivity type first drift region, becomes an extremely small value. Thus, current flown into the second semiconductor region becomes extremely small. With this structure, in the semiconductor device, in which the temperature sensing diode part and the power semiconductor element part are provided in the same semiconductor substrate, it is possible to prevent degradation of temperature detection accuracy of the temperature sensing diode part.

Details of the technology disclosed in this description, and further improvements are explained in detail in "Detailed Description of Embodiments", and examples.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
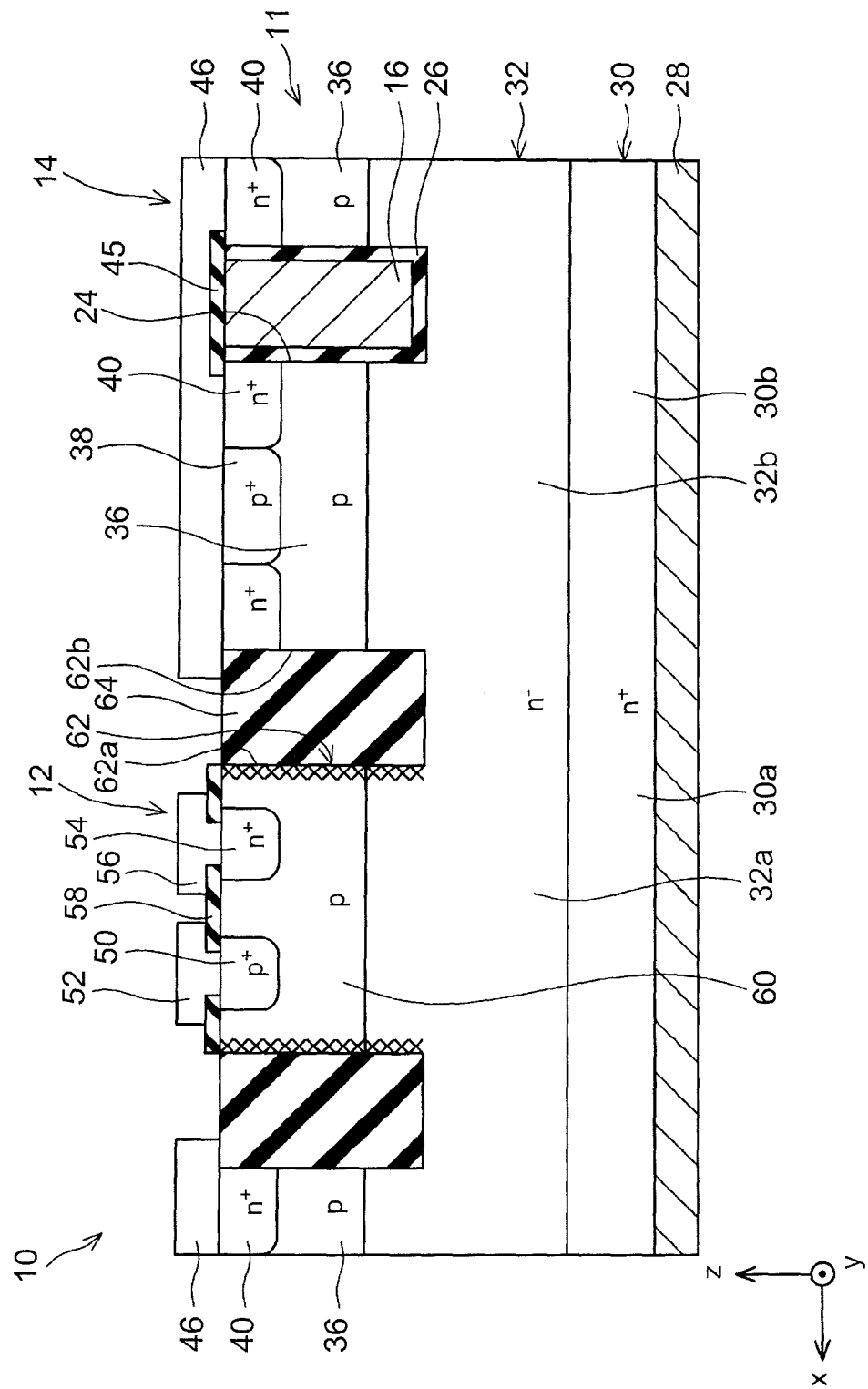
FIG. 1 shows a vertical sectional view of a semiconductor device according to a first example.

Listed are main features of examples explained below. Technical elements stated below are independent from each other, and exert technical usefulness alone or as various combinations, so the technical elements are not limited to combinations stated in claims at the time of filing.

(Feature 1) In a semiconductor device disclosed in this description, an inside of an isolation trench may be entirely filled with an insulator. In general, if an insulator is arranged inside a trench, defects are generated when, for example, the trench is formed, and the defects are generated near regions of side walls and a bottom wall (hereinafter, sometimes simply referred to as "side walls and so on") of the trench, where the insulator is arranged. When a thickness of the insulator is relatively small, defects are reduced by nitriding. In the above-mentioned semiconductor device, inside of the isolation trench is entirely filled with the insulator. Therefore, the thickness of the insulator becomes large, and it becomes hard to reduce defects compared to a structure where, for example, a relatively thin insulator is arranged on the side walls and so on of the isolation trench, because nitrogen atoms do not reach an interface even if nitriding is performed. Therefore, even if nitriding is performed, a large number of defects remain near the interface between the first base region and the isolation trench. As a result, it is possible to reduce a value of a current amplification factor hFE of a parasitic bipolar transistor, and it is possible to prevent degradation of temperature detection accuracy of the temperature sensing diode part.

(Feature 2) In the semiconductor device disclosed in this description, a power semiconductor element may include a third semiconductor region, a fourth semiconductor region, a second base region, a second drift region, a first gate electrode, and a first insulator. The third semiconductor region may be of a first conductivity type, and arranged in a range that faces an upper surface of a semiconductor substrate. The fourth semiconductor region may be of a second conductivity type, and arranged in a range that faces the upper surface of the semiconductor substrate. The second base region may be of the first conductivity type, and be in contact with lower surfaces of the third semiconductor region and the fourth semiconductor region. The second drift region may be of the second conductivity type, located below the second base region, and isolated from the third semiconductor region and the fourth semiconductor region by the second base region. The first gate electrode may be arranged inside a gate trench passing through the second base region and extending to the second drift region, and face the second base region in a range that isolates the fourth semiconductor region and the second drift region from each other. The first insulator may be arranged between the first gate electrode and an inner wall of the gate trench. A second gate electrode and a second insulator may be arranged inside an isolation trench. The second gate electrode faces the second base region in a range that isolates the fourth semiconductor region and the second drift region from each other on a side of one of the side walls of the isolation trench, and faces a first base region on a side of the other side wall of the isolation trench. The second insulator is arranged between the second gate electrode and an inner wall of the isolation trench. A thickness of the second insulator on the other side wall of the isolation trench may be larger than a thickness of the second insulator on one of the side walls of the isolation trench.

In the above-mentioned semiconductor device, the second gate electrode is arranged inside the isolation trench, and the second insulator is arranged between the second gate electrode and the inner wall of the isolation trench. A thickness of the second insulator on the other side wall of the isolation trench is set to be larger than the thickness of the second insulator on one of the side walls of the isolation trench. According to this structure, the number of defects that remain when nitriding is carried out is larger near the other side wall of the isolation trench (on the side of the temperature sensing diode part) than the number of defects near one of the side walls of the isolation trench (on the side of the power semiconductor element part). Thus, defects remain near a boundary between the first base region and the isolation trench on the side of the temperature sensing diode part. Therefore, a current amplification factor hFE of a parasitic bipolar transistor is reduced, thereby preventing degradation of temperature detection accuracy of the temperature sensing diode part. By arranging the second gate electrode inside the isolation trench, a channel density of the power semiconductor element is increased when the semiconductor device is on.

(Feature 3) In the semiconductor device disclosed in this description, the temperature sensing diode part may include a first conductivity type buried layer that is in contact with an upper surface of the first drift region and is in contact with a lower surface of the first base region. The buried layer may be in contact with at least the other side wall of the isolation trench. According to this structure, a base width of a parasitic bipolar transistor is increased, and a current amplification factor hFE is reduced. Therefore, it is possible to further prevent degradation of temperature detection accuracy of the temperature sensing diode part.

(Feature 4) In the semiconductor device disclosed in this description, the temperature sensing diode part may include the first conductivity type buried layer that is in contact with the upper surface of the first drift region, and is in contact with the lower surface of the first base region. The first drift region may be arranged between the buried layer and the isolation trench. A minority carrier flown into the first base region from the second semiconductor region is flown towards the first drift region that is in contact with the lower surface of the first base region. According to Feature 4, by arranging the buried layer on the lower surface of the first base region, the first drift region, which is in contact with the lower surface of the first base region, is narrowed down to a region between the isolation trench and the buried layer. Therefore, the minority carrier flown into the first base region is flown towards the first drift region between the buried layer and the isolation trench. This means that the minority carrier moves in the first base region along the vicinity of the side walls of the isolation trench. As a result, the minority carrier is effectively captured by defects generated near the side walls of the isolation trench. Thus, it is possible to prevent degradation of temperature detection accuracy of the temperature sensing diode part.

(Feature 5) In the semiconductor device disclosed in this description, a lifetime killer may be included in the first base region. According to this structure, lifetime of the minority carrier flown into the first base region is reduced by the lifetime killer. Therefore, it is possible to prevent degradation of temperature detection accuracy of the temperature sensing diode part.

(Feature 6) In the semiconductor device disclosed in this description, a material of the semiconductor substrate may be SiC. According to this structure, it is possible to use the semiconductor device under relatively high temperature (for example, 250° C.).

A semiconductor device 10 of the example is explained. As shown in FIG. 1, the semiconductor device 10 is provided with a semiconductor substrate 11. In the semiconductor substrate 11, an element region and a non-element region that surrounds the element region are formed. The element region is explained below, and explanation of the non-element region is omitted because the non-element region is a structure of a related technology. In this example, a substrate made of, but not limited to, SiC is used as the semiconductor substrate 11, and a substrate made of a different material (such as a Si substrate) may be used.

Figure 2:
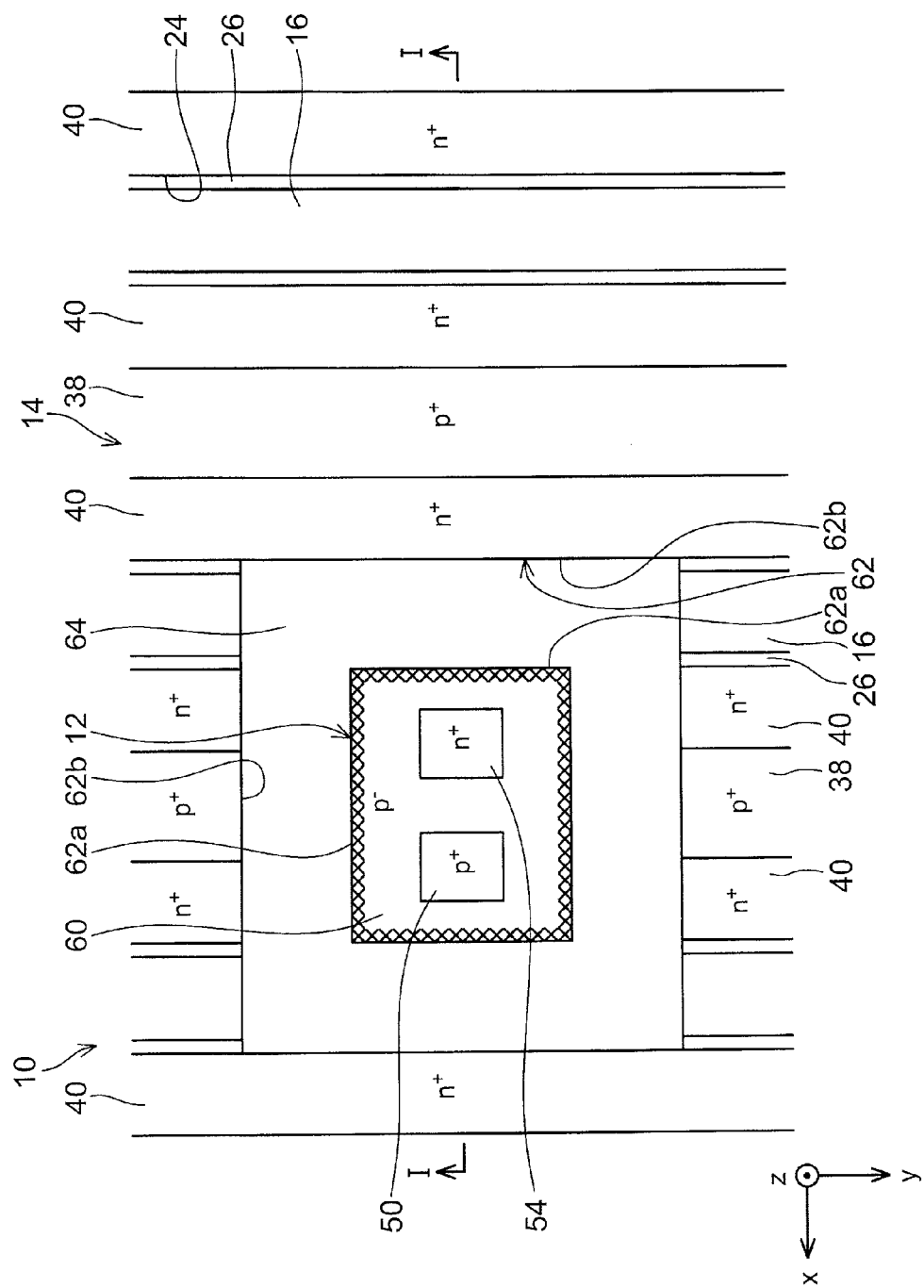
FIG. 2 shows a plan view of the semiconductor device according to the first example.

A structure of the element region is explained with reference to FIG. 1 and FIG. 2. FIG. 2 is a plan view of the semiconductor device 10, and FIG. 1 shows a sectional view taken along the line I-I in FIG. 2. In FIG. 2, illustration of electrodes and insulating films formed on an upper surface of the semiconductor substrate 11 is omitted in order to simplify the drawing. A temperature sensing diode part 12, an insulation gate-type semiconductor element part 14, and an isolation trench 62 are formed in the element region of the semiconductor substrate 11. The insulation gate-type semiconductor element part 14 corresponds to an example of the "power semiconductor element part".

First of all, the temperature sensing diode part 12 is explained. In a region of the temperature sensing diode part 12, which faces the upper surface of the semiconductor substrate 11, a p+ type anode region 50 and an n+ type cathode region 54 are formed. The anode region 50 and the cathode region 54 are formed so as to be separated from each other. Further, in a region that faces the upper surface of the semiconductor substrate 11, a p type base region 60 is formed. The base region 60 is also arranged between the anode region 50 and the cathode region 54. As shown in FIG. 2, in the plan view of the semiconductor device 10, the base region 60 is formed into a generally rectangular shape. An impurity concentration of the base region 60 is set to be lower than an impurity concentration of the anode region 50. The base region 60 is in contact with side surfaces and a lower surface of the anode region 50, and side surfaces and a lower surface of the cathode region 54, and surrounds the anode region 50 and the cathode region 54. The anode region 50, the cathode region 54, and the base region 60 structure a temperature sensing diode. An n− type drift region 32a is formed below the base region 60. The drift region 32a is in contact with a lower surface of the base region 60, and is isolated from the anode region 50 and cathode region 54 by the base region 60. An impurity concentration of the drift region 32a is set to be lower than an impurity concentration of the cathode region 54. An n+ type drain region 30a is formed below the drift region 32a. The drain region 30a is in contact with a lower surface of the drift region 32a, and is formed in a range that faces a lower surface of the semiconductor substrate 11. An impurity concentration of the drain region 30a is set to be higher than the impurity concentration of the drift region 32a. The drain region 30a is isolated from the base region 60 by the drift region 32a. The anode region 50 corresponds to an example of the "first semiconductor region", the cathode region 54 corresponds to an example of the "second semiconductor region", the base region 60 corresponds to an example of the "first base region", and the drift region 32a corresponds to an example of the "first drift region".

An insulating film 58 is formed in a region in the upper surface of the semiconductor substrate 11, in which the temperature sensing diode part 12 is formed. Openings are formed in the insulating film 58 so that a part of an upper surface of the anode region 50 and a part of an upper surface of the cathode region 54 are exposed. The insulating film 58 covers an upper surface of the base region 60. An anode electrode 52 and a cathode electrode 56 are formed on the upper surface of the semiconductor substrate 11. The anode electrode 52 is in ohmic contact with the anode region 50 through the opening formed in the insulating film 58, and the cathode electrode 56 is in ohmic contact with the cathode region 54 through the opening formed in the insulating film 58.

Next, the insulation gate-type semiconductor element part 14 is explained. In the insulation gate-type semiconductor element part 14, n+ type source regions 40 and p+ type contact regions 38 are formed in a region that faces the upper surface of the semiconductor substrate 11. The source regions 40 and the contact regions 38 are not formed in a region where a later-described isolation trench 62 is formed. The contact regions 38 are formed so as to be in contact with side surfaces of the source regions 40. As shown in FIG. 2, in a plan view of the semiconductor device 10, the source regions 40 and the contact regions 38 extend in an y axis direction, and are formed in strips. The p+ type contact region 38 corresponds to an example of the "first conductivity-type third semiconductor region", and the n+ type source region 40 corresponds to an example of the "second conductivity-type fourth semiconductor region".

A p type base region 36 is formed below the source regions 40 and the contact regions 38. An impurity concentration of the base region 36 is set to be lower than an impurity concentration of the contact regions 38. The base region 36 is in contact with lower surfaces of the source regions 40, and lower surfaces of the contact regions 38. Therefore, the source regions 40 are surrounded by the base region 36 and the contact regions 38. The base region 36 and the base region 60 may be formed integrally in the same process, or may be formed separately. The base region 36 corresponds to an example of the "second base region".

An n− type drift region 32b is further formed below the base region 36. The drift region 32b is isolated from the source regions 40 and the contact regions 38 by the base region 36. An impurity concentration of the drift region 32b is set to be lower than an impurity concentration of the source region 40. The drift region 32b corresponds to an example of the "second drift region". The drift region 32b is formed integrally with the drift region 32a of the temperature sensing diode part 12. This means that the drift region 32a and the drift region 32b are in contact with each other, and side surfaces of the drift region 32a are surrounded by the drift region 32b. Further, the drift regions 32a, 32b are formed in the overall surface of the semiconductor substrate 11. Occasionally, the drift region 32a and the drift region 32b will be collectively referred to as a drift region 32 herein below.

In the insulation gate-type semiconductor element part 14, a gate trench 24 is formed in the semiconductor substrate 11. The gate trench 24 passes through the source region 40 and the base region 36 from the upper surface of the semiconductor substrate 11, and a lower end of the gate trench 24 extends to the drift region 32b. A gate electrode 16 is formed inside the gate trench 24. The gate electrode 16 is formed so that a lower end of the gate electrode 16 is slightly deeper than a lower surface of the base region 36. An insulator 26 is filled between a wall surface of the gate trench 24 and the gate electrode 16 (in other words, on the side and below the gate electrode 16). Therefore, the gate electrode 16 faces the base region 36 and the source regions 40 through the insulator 26. A cap insulating film 45 is formed in an upper surface of the gate electrode 16. As shown in FIG. 2, in a plan view of the semiconductor device 10, the gate trench 24 extends in the y axis direction between the source regions 40, and the gate electrode 16 extends in the y axis direction between the gate trenches 24. Therefore, the insulator 26 also extends in the y axis direction. Examples for the insulator 26 include, but not limited to, $SiO_2$, SiN, and $Al_2O_3$. The gate electrode 16 corresponds to an example of the "first gate electrode", and the insulator 26 corresponds to an example of the "first insulator".

An n+ type drain region 30b is formed in a range that faces the lower surface of the semiconductor substrate 11. An impurity concentration of the drain region 30b is set to be higher than the impurity concentration of the drift region 32b. The drain region 30b is in contact with a lower surface of the drift region 32b. The drain region 30b is isolated from the base region 36 by the drift region 32b. The drain region 30b is formed integrally with the drain region 30a of the temperature sensing diode part 12. In other words, the drain regions 30a, 30b are formed in the overall surface of the semiconductor substrate 11. The drain regions 30a, 30b are sometimes simply referred to as a drain region 30 herein below.

A drain electrode 28 is formed on the lower surface of the semiconductor substrate 11. The drain electrode 28 is formed on the overall surface of the semiconductor substrate 11. This means that the drain electrode 28 is formed below the temperature sensing diode part 12 and the insulation gate-type semiconductor element part 14. The drain electrode 28 is in ohmic contact with the drain region 30. A source electrode 46 is formed in the region where the insulation gate-type semiconductor element part 14 is formed in the upper surface of the semiconductor substrate 11. The source electrode 46 is in ohmic contact with the source regions 40 and the contact regions 38. The source electrode 46 is insulated from the gate electrode 16 by the cap insulating film 45.

Next, an isolation trench 62 is explained. The isolation trench 62 is formed in the semiconductor substrate 11. The isolation trench 62 passes through the base region 60 and the base region 36, and extends to the drift region 32. The isolation trench 62 is formed so as to surround an outer periphery of the temperature sensing diode part 12. To be specific, as shown in FIG. 2, the isolation trench 62 includes isolation trenches extending in the y axis direction, and isolation trenches extending in the x axis direction, and a side wall 62a of the isolation trench 62 is in contact with the base region 60 and the drift region 32a. Therefore, the base region 60 is surrounded by the isolation trench 62 in an xy-plane direction. On the other hand, a side wall 62b of the isolation trench 62 is in contact with the insulation gate-type semiconductor element part 14. To be specific, the side wall 62b of the isolation trench 62, which extends in the y axis direction, is in contact with the source region 40, the base region 36, and the drift region 32b, and the side wall 62b of the isolation trench 62 extending in the x axis direction is in contact with the source region 40, the contact region 38, the base region 36, and the drift region 32b. In FIG. 1 and FIG. 2, the source region 40 which is in contact with the side wall 62b is not always required. In FIG. 1 and FIG. 2, defects near the side wall 62b are not shown, but they can be present there. The side wall 62a of the isolation trench 62 corresponds to an example of the "other side wall of the isolation trench", and the side wall 62b of the isolation trench 62 corresponds to an example of "one of side walls of the isolation trench.

The isolation trench 62 extending in the y axis direction is connected with the gate trench 24. In other words, the isolation trench 62 extending in the y axis direction and the gate trench 24 are a continuous trench, and are formed integrally with each other. On the other hand, the isolation trench 62 extending in the x axis direction is formed between the neighboring gate trenches 24 so as to be generally orthogonal to the gate trenches 24. Inside of the isolation trench 62 is entirely filled with an insulator 64. Examples of the insulator 64 include, but not limited to, $SiO_2$, SiN, and $Al_2O_3$.

When using the foregoing semiconductor device 10, the drain electrode 28 is connected with a power supply potential, and the source electrode 46 is connected with a ground potential. When potential applied to a gate pad (not shown) is less than threshold potential, the semiconductor device 10 is off. On the other hand, potential applied to the gate pad is threshold potential or above, the semiconductor device 10 is on. In other words, in the region where the insulation gate-type semiconductor element part 14 is formed, potential applied to the gate pad is applied to the gate electrode 16 through gate wiring (not shown). Once potential applied to the gate electrode 16 becomes threshold potential or above, a channel is formed in the base region 36 in a range that is in contact with the insulator 26. Thus, electrons flow from the source electrode 46 to the drain electrode 28 through the source region 40, the channel in the base region 36, the drift region 32b, and the drain region 30. In short, current flows from the drain electrode 28 to the source electrode 46. Once current flows through the insulation gate-type semiconductor element part 14 as stated above, heat is generated in the semiconductor element part 14, and temperature of the semiconductor element part 14 increases.

Such a temperature change of the insulation gate-type semiconductor element part 14 is detected by a diode of the temperature sensing diode part 12. In short, once current is flown from a current source (not shown) through the temperature sensing diode part 12, current is flown from the p+ type anode region 50 to the n+ type cathode region 54 through the p type base region 60. By measuring voltage between the anode electrode 52 and the cathode electrode 56 (in short, forward voltage) at this time, the diode of the temperature sensing diode part 12 detects temperature of the insulation gate-type semiconductor element part 14. Potential of the anode electrode 52 is set to be lower than potential of the drain electrode 28.

In the semiconductor device 10 of this example, the isolation trench 62 is formed in the semiconductor substrate 11. In general, when a trench is formed in a semiconductor substrate, defects are generated near a boundary between the trench and the semiconductor substrate. Therefore, defects (marked as x in FIG. 1) are generated near the side walls and a bottom wall of the isolation trench 62. It should be noted that FIG. 1 only shows defects near the side wall 62a of the isolation trench 62. The same applies to FIG. 2 to FIG. 6. The base region 60 provided in the temperature sensing diode part 12 is surrounded by the isolation trench 62 in the xy-plane direction. In other words, a part of the side wall 62a of the isolation trench 62 is in contact with the base region 60. Therefore, there are defects near a boundary between the base region 60 and the side wall 62a of the isolation trench 62. Here, once the diode of the temperature sensing diode part 12 is turned on, electrons are flown into the base region 60 from the cathode region 54 due to forward bias between the p type base region 60 and the n+ type cathode region 54. Majority of the electrons flown into the base region 60 (in other words, a minority carrier in the base region 60) is flown to the anode region 50, a part of the electrons is flown in a direction to the drift region 32a. The electrons flown in the direction to the drift region 32a are captured by defects that are present near the boundary between the base region 60 and the side wall 62a of the isolation trench 62, and recombined with the defects. Thus, lifetime of electrons is reduced compared to a case where the isolation trench 62 is not formed. Hence, electrons flown into the drift region 32a from the base region 60 is reduced, and a current amplification factor hFE of an npn parasitic bipolar transistor, which is structured by the cathode region 54, the base region 60, and the drift region 32a, is decreased. Therefore, current flown into the cathode region 54 from the drift region 32a through the base region 60 is reduced. As a result, even if the temperature sensing diode part 12 and the insulation gate-type semiconductor element part 14 are formed in the same semiconductor substrate 11, the temperature sensing diode part 12 is less likely to be affected by current flowing in the parasitic bipolar transistor, thereby preventing deterioration of temperature detection accuracy of the temperature sensing diode part 12.

Further, in this example, inside of the isolation trench 62 is entirely filled with the insulator 64. When a trench is formed by using a dry etching method, defects caused by the dry etching are generated near a side wall and so on of the trench. In a trench gate-type semiconductor element, since such defects lead to a reduction in current density, processing is carried out for reducing defects by nitriding. In this example, nitriding is also performed after the insulator 26 is formed in the gate trench 24, and the insulator 64 is formed in the isolation trench 62. The reason why defects are reduced by nitriding is considered to be the fact that nitrogen atoms reach an interface and terminates dangling bond. Since inside of the isolation trench 62 is entirely filled with the insulator 64, the thickness of the insulator 64 is significantly larger than a thickness of the insulator 26. Therefore, near the side wall and so on of the isolation trench 62, there are less nitrogen atoms that reach the interface due to nitriding, compared to nitrogen atoms near the side wall and so on of the gate trench 24. Hence, even though nitriding is carried out, an effect of decreasing defects is low near the side wall and so on of the isolation trench 62, and majority of defects remain. As a result, a large number of defects are able to remain near the boundary between the base region 60 and the side wall 62a of the isolation trench 62, and the current amplification factor hFE of the parasitic bipolar transistor is significantly reduced. Thus, even though the temperature sensing diode part 12 and the insulation gate-type semiconductor element part 14 are formed in the same semiconductor substrate 11, it is possible to prevent degradation of temperature detection accuracy of the temperature sensing diode part 12.

Figure 3:
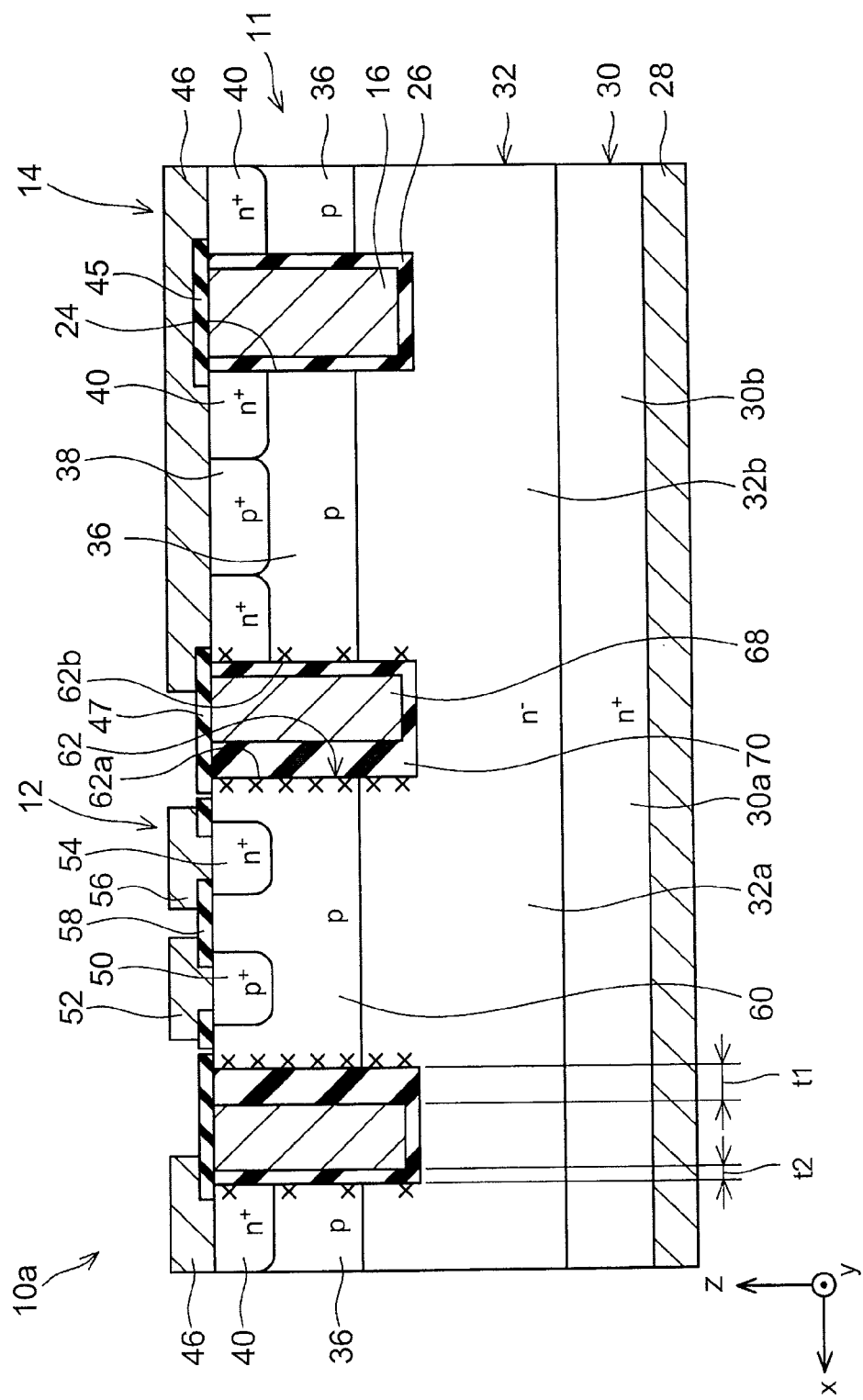
FIG. 3 shows a vertical sectional view of a semiconductor device according to a second example.

Next, a second example is explained with reference to FIG. 3. Explained below is a difference from the first example only, and detailed explanation of the same structure as the first example is omitted.

In a semiconductor device 10a according to the second example, a gate electrode 68 is formed inside an isolation trench 62. The gate electrode 68 is formed so that a lower end of the gate electrode 68 is slightly deeper than a lower surface of a base region 36. An insulator 70 is filled between a wall surface of the isolation trench 62 and the gate electrode 68 (in short, on sides and below the gate electrode 68). Therefore, the gate electrode 68 faces the base region 36 and a source region 40 through the insulator 70 on a side of a side wall 62b of the isolation trench 62, and the gate electrode 68 faces a base region 60 through the insulator 70 on a side of a side wall 62a. A thickness t1 of the insulator 70 on the side wall 62a of the isolation trench 62 is set to be larger than a thickness t2 of the insulator 70 on the side wall 62b. In this example, the thickness t1 of the insulator 70 is generally the same as a thickness of an insulator 26 formed in a gate trench 24. A cap insulating film 47 is formed on an upper surface of the gate electrode 68. Examples of the insulator 70 include, but not limited to, $SiO_2$, $SiN$, and $Al_2O_3$. The gate electrode 68 corresponds to an example of the "second gate electrode", and the insulator 70 corresponds to an example of the "second insulator".

In the semiconductor device 10a of the second example, the thickness t1 of the insulator 70 on the side of the side wall 62a of the isolation trench 62 is larger than the thickness t2 of the insulator 70 on the side of the side wall 62b. With this structure, near the side wall 62a of the isolation trench 62, there are more defects that remain when nitriding is carried out than those near the side wall 62b. Therefore, defects remain near a boundary between the base region 60 and the side wall 62a of the isolation trench 62. Hence, a current amplification factor hFE of a parasitic bipolar transistor is reduced, thereby preventing degradation of temperature detection accuracy of a temperature sensing diode part 12. By forming the gate electrode 68 inside the isolation trench 62, once the semiconductor device 10a is turned on, a channel is also formed in the base region 36 in a range that is in contact with the insulator 70. Therefore, a channel density of an insulation gate-type semiconductor element part 14 is improved.

Figure 4:
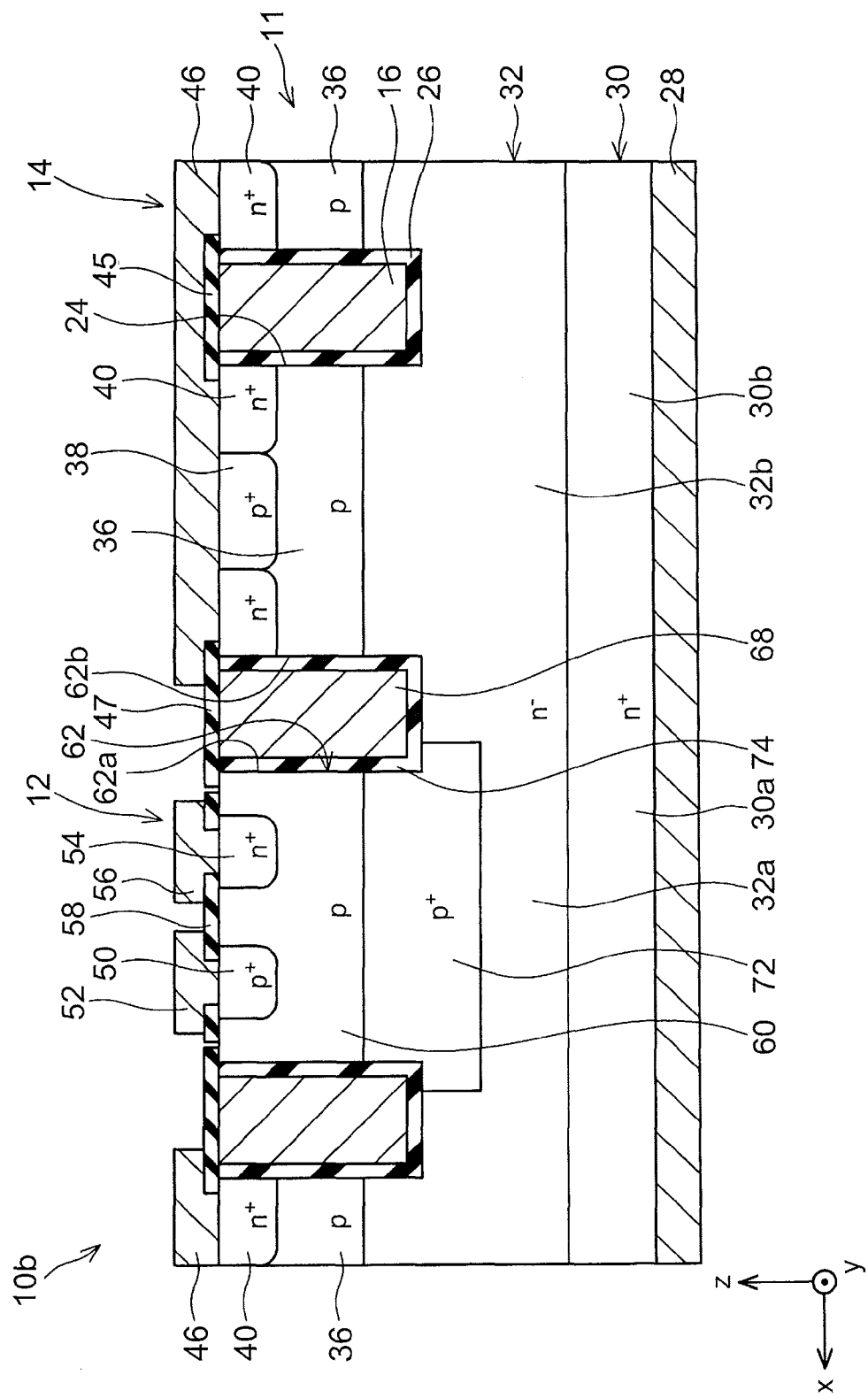
FIG. 4 shows a vertical sectional view of a semiconductor device according to a third example.

Next, a third example is explained with reference to FIG. 4. Explained below is a difference from the second example only, and detailed explanation of the same structure as the second example is omitted.

In a semiconductor device 10b of the third example, an insulator 74 is filled between a wall surface of an isolation trench 62 and a gate electrode 68. A thickness of the insulator 74 on a side wall 62a of the isolation trench 62 is generally the same as a thickness of the insulator 74 on a side wall 62b. In this example, these thicknesses are generally the same as a thickness of an insulator 26 of a gate trench 24. A p+ type buried layer 72 is formed in a range in a semiconductor substrate 11, which faces an upper surface of a drift region 32a. The buried layer 72 is in contact with a lower surface of a base region 60, a part of the side wall 62a of the isolation trench 62, and a part of a bottom wall of the isolation trench 62. An impurity concentration of the buried layer 72 is set to be higher than an impurity concentration of the base region 60. With this structure, a base width of an npn parasitic bipolar transistor is increased by a thickness of the buried layer 72 (a length in a z axis direction). Thus, a current amplification factor hFE of a parasitic bipolar transistor is reduced. In this example, since the thickness of the insulator 74 on the side wall 62a of the isolation trench 62 is relatively small, defects remaining near the side wall 62a after nitriding are reduced compared to the first and second examples. However, as stated above, it is possible to reduce a value of the current amplification factor hFE of the parasitic bipolar transistor by the buried layer 72. Therefore, the same effect as the semiconductor device 10a of the second example is obtained. In this example, the gate electrode 68 is formed inside the isolation trench 62. However, the present invention is not limited to this, and the isolation trench 62 may be entirely filled with the insulator 74.

Figure 5:
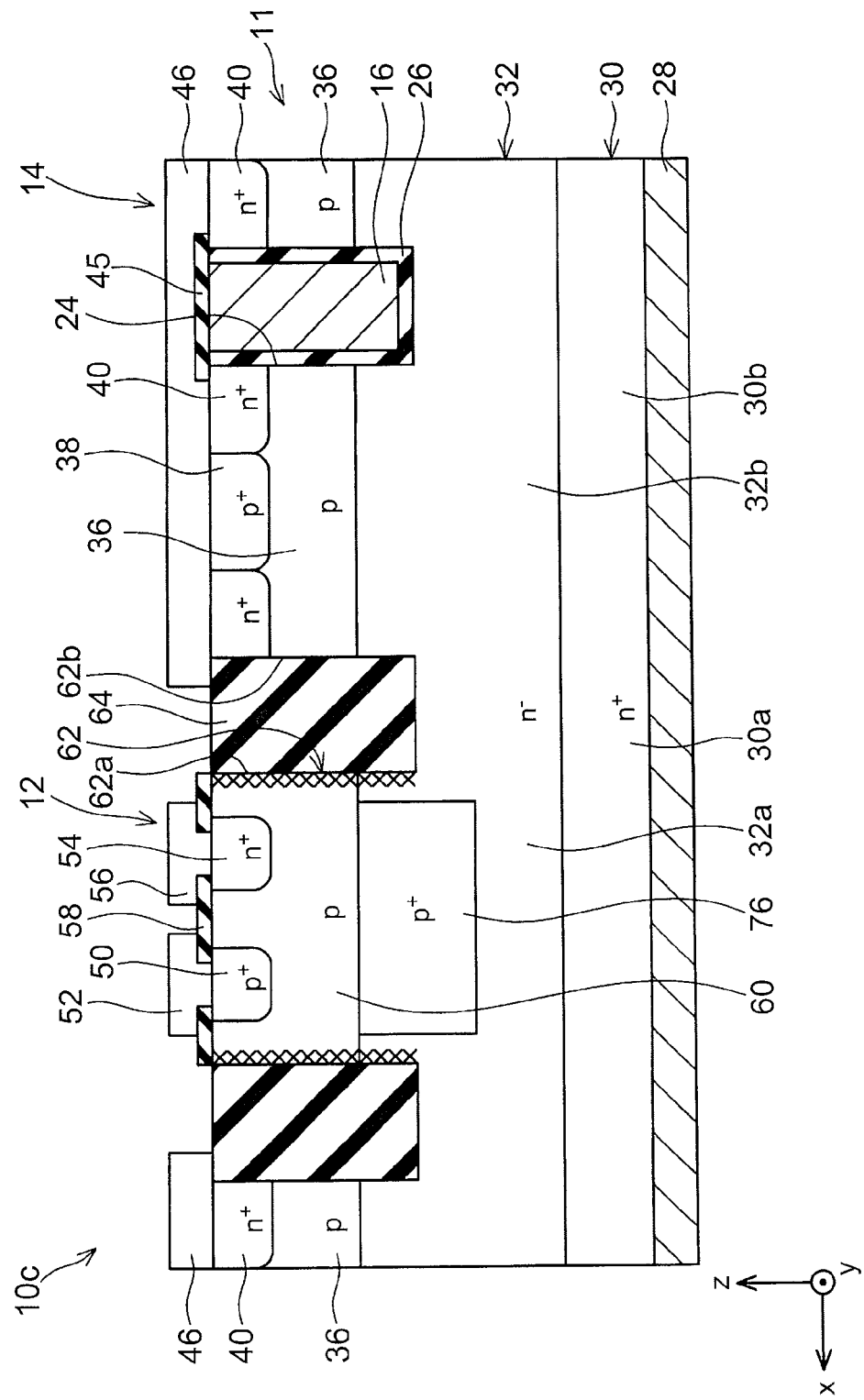
FIG. 5 shows a vertical sectional view of a semiconductor device according to a fourth example.

Next, a fourth example is explained with reference to FIG. 5. Explained below is a difference from the first example only, and detailed explanation of the same structure as the first example is omitted.

In a semiconductor device 10c of the fourth example, a p+ type buried layer 76 is formed in a range of a semiconductor substrate 11, which faces an upper surface of a drift region 32a. The buried layer 76 is in contact with a part of a lower surface of a base region 60, and is separated from a side wall 62a of an isolation trench 62. Therefore, the buried layer 76 is isolated from the side wall 62a by the drift region 32a. In other words, the drift region 32a is arranged between the buried layer 76 and the side wall 62a of the isolation trench 62. An impurity concentration of the buried layer 76 is set to be higher than an impurity concentration of the base region 60. With this structure, by arranging the buried layer 76 on the lower surface of the base region 60, the drift region 32a, which is in contact with the lower surface of the base region 60, is narrowed down to a region between the side wall 62a of the isolation trench 62 and the buried layer 76. Therefore, a parasitic bipolar transistor is structured by a cathode region 54, the base region 60, and the drift region 32a between the buried layer 76 and the side wall 62a of the isolation trench 62. Therefore, electrons flowing from the cathode region 54 into the base region 60 flow towards the drift region 32a between the buried layer 76 and the side wall 62a of the isolation trench 62. In short, electrons move in the base region 60 along the vicinity of the side wall 62a of the isolation trench 62. As a result, electrons are able to be captured effectively by defects generated near the side wall 62a of the isolation trench 62. In other words, it can be said that the buried layer 76 controls a flow of electrons that try to flow into the drift region 32a from the base region 60. In short, by arranging the buried layer 76 in a generally center part of the lower surface of the base region 60, electrons flown into the base region 60 from the cathode region 54 try to flow while avoiding a region where the buried layer 76 is formed. Therefore, electrons flown into the base region 60 move along the vicinity of the side wall 62a of the isolation trench 62, and are captured by defects near the side wall 62a. Thus, a current amplification factor hFE of a parasitic bipolar transistor is significantly reduced. Therefore, the same effect as the semiconductor device 10 of the first example is obtained. In this example, the inside of the isolation trench 62 is entirely filled with an insulator 64. However, the present invention is not limited to this. For example, like the second example, a structure may be used, in which a gate electrode 68 is formed inside the isolation trench 62, and a thickness of an insulator 70 on the side of the side wall 62a is larger than a thickness of the insulator 70 on the side of a side wall 62b. In short, any structure may be used as long as a relatively large number of defects are present near a boundary between the base region 60 and the side wall 62a.

Figure 6:
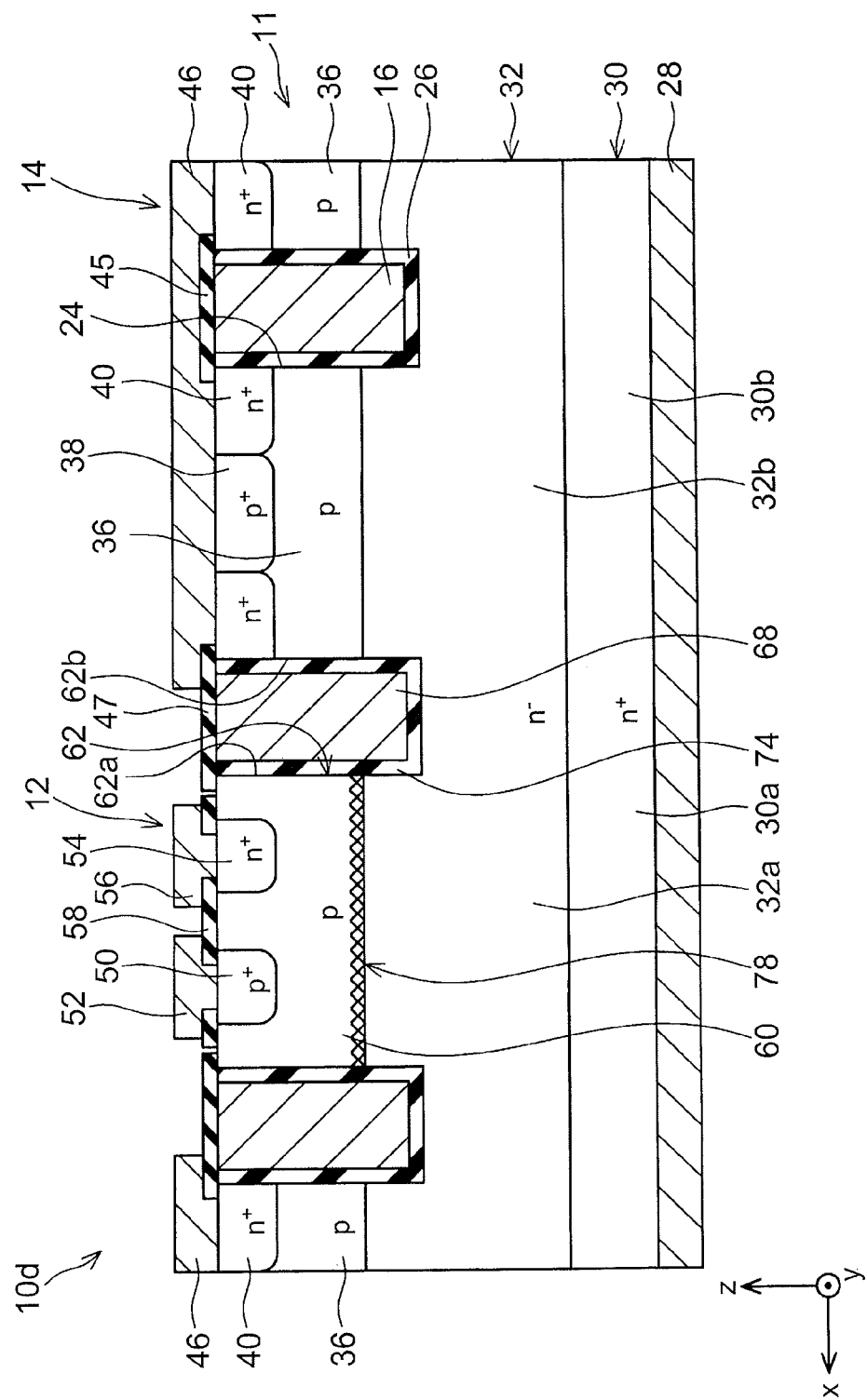
FIG. 6 shows a vertical sectional view of a semiconductor device according to a fifth example.

Next, a fifth example is explained with reference to FIG. 6. Explained below is a difference from the third example only, and detailed explanation of the same structure as the third example is omitted.

In a semiconductor device 10d of the fifth example, instead of forming a buried layer 72, heavy metal is ion-implanted into a base region 60, and defects (marked as × in FIG. 6) are formed on a lower surface of the base region 60. Examples of the heavy metal include, but not limited to, platinum, gold, iron, or a mixture of platinum, gold, and iron. These defects work as a lifetime killer 78. In short, majority of electrons flown from a cathode region 54 to the base region 60 are recombined with these defects, and lifetime of the electrons is significantly reduced. Therefore, electrons are hardly flown into a drift region 32a, and a current amplification factor hFE of a parasitic bipolar transistor is reduced. Therefore, the same effect as the semiconductor device 10b of the third example is obtained. In this example, the lifetime killer 78 is formed by ion implantation. However, the present invention is not limited to this. For example, a lifetime killer may be formed by ion irradiation, or inside of an isolation trench 62 may be entirely filled with insulator 74.

Although the examples of the technology disclosed in this description have been explained in detail, these examples are just examples, and the semiconductor device disclosed in this description includes the foregoing examples with various modifications and changes.

For instance, in the foregoing example, the side wall 62b of the isolation trench 62 is in contact with the insulation gate-type semiconductor element part 14. However, the present invention is not limited to this, and it is only necessary that at least a part of the side wall 62b is in contact with the insulation gate-type semiconductor element part 14. Also, instead of the structure where inside of the isolation trench 62 is entirely filled with the insulator, the isolation trench 62 may be partially filled with the insulator. Conductivity types are not limited to the conductivity types according to the foregoing examples. In short, a structure may be such that the "n type" corresponds to the "first conductivity type", and the "p type" corresponds to the "second conductivity type".

Although the specific examples of the present invention have been explained in detail, those examples are just examples, and do not limited to the scope of claims. The technology described in the scope of claims includes the specific examples stated above with various modifications and changes. The technical elements described in this description or the drawings exert technical usefulness alone or as various combinations, and are not limited to the combinations described in the scope of claims. The technology described as examples in this description or the drawings achieve a plurality of objects at the same time, and has technical usefulness by achieving one of the objects.

What is claimed is:
1. A semiconductor device comprising:
  a semiconductor substrate in which a power semiconductor element part and a temperature sensing diode part are provided, wherein
  the temperature sensing diode part includes:
  a first semiconductor region that is a first conductivity type and arranged in a range that faces an upper surface of the semiconductor substrate;
  a second semiconductor region that is a second conductivity type and arranged in a region that faces the upper surface of the semiconductor substrate;
  a third semiconductor region that is the first conductivity type and arranged in a range that faces the upper surface of the semiconductor substrate;
  a fourth semiconductor region that is the second conductivity type and arranged in a range that faces the upper surface of the semiconductor substrate;
  a first base region that is the first conductivity type, arranged in a range that faces the upper surface of the semiconductor substrate, and in contact with and surrounds the first semiconductor region and the second semiconductor region;
  a first drift region that is the second conductivity type, in contact with a lower surface of the first base region, and isolated from the first semiconductor region and the second semiconductor region by the first base region,
  a second base region that is the first conductivity type and in contact with lower surfaces of the third semiconductor region and the fourth semiconductor region;
  a second drift region that is the second conductivity type, located below the second base region, and isolated from the third semiconductor region and the fourth semiconductor region by the second base region;

a first gate electrode that is arranged in a gate trench passing through the second base region and extending to the second drift region, and faces the second base region in a range that isolates the fourth semiconductor region and the second drift region from each other; and a first insulator arranged between the first gate electrode and an inner wall of the gate trench, an isolation trench is disposed in the semiconductor substrate, the isolation trench passing through the first base region, extending to the first drift region, and surrounding an outer periphery of the temperature sensing diode part, at least a part of one of side walls of the isolation trench is in contact with the power semiconductor element part, and the other side wall of the isolation trench is in contact with the temperature sensing diode part, and a second insulator is arranged in the isolation trench, wherein the thickness of the second insulator is larger than a thickness of the first insulator.

2. The semiconductor device according to claim 1, wherein inside of the isolation trench is entirely filled with an insulator.

3. The semiconductor device according to claim 1, wherein the power semiconductor element part includes:

a second gate electrode that faces the second base region in the range isolating the fourth semiconductor region and the second drift region from each other on a side of one of the side walls of the isolation trench, and faces the first base region on a side of the other side wall of the isolation trench is arranged in the isolation trench, the second insulator being arranged between the second gate electrode and the inner wall of the isolation trench, and the thickness of the second insulator on the other side wall of the isolation trench is larger than the thickness of the second insulator on one of the side walls of the isolation trench.

4. The semiconductor device according to claim 1, wherein the temperature sensing diode part is provided with a buried layer of the first conductivity type, which is in contact with an upper surface of the first drift region and is in contact with the lower surface of the first base region, and the buried layer is in contact with at least the other side wall of the isolation trench.

5. The semiconductor device according to claim 1, wherein the temperature sensing diode part is provided with a buried layer of the first conductivity type, which is in contact with an upper surface of the first drift region and is in contact with the lower surface of the first base region, and the first drift region is arranged between the buried layer and the isolation trench.

6. The semiconductor device according to claim 1, wherein the first base region includes a lifetime killer.

7. The semiconductor device according to claim 1, wherein a material of the semiconductor substrate is SiC.

* * * * *